(12) United States Patent
Lin

(10) Patent No.: US 6,243,308 B1
(45) Date of Patent: Jun. 5, 2001

(54) METHOD FOR TESTING DYNAMIC RANDOM ACCESS MEMORY UNDER WAFER-LEVEL-BURN-IN

(75) Inventor: Shih-Chin Lin, Keohsiung (TW)

(73) Assignee: United Microelectronics Corp., Hsin-Chu City (TW)

( * ) Notice: Subject to any disclaimer, the term of this patent is extended or adjusted under 35 U.S.C. 154(b) by 0 days.

(21) Appl. No.: 09/511,653

(22) Filed: Feb. 22, 2000

(51) Int. Cl.[7] .............................. G11C 7/00; G11C 11/24
(52) U.S. Cl. ........................ 365/201; 365/63; 365/149
(58) Field of Search .............................. 365/201, 51, 63, 365/190, 205, 149

(56) References Cited

U.S. PATENT DOCUMENTS

| | | | |
|---|---|---|---|
| 5,138,578 | * | 8/1992 | Fujii ..................................... 365/203 |
| 5,420,816 | * | 5/1995 | Ogihara et al. ........................ 365/63 |
| 5,602,772 | * | 2/1997 | Nakano et al. ........................ 365/51 |
| 5,790,465 | * | 8/1998 | Roh et al. ............................. 365/201 |

* cited by examiner

Primary Examiner—Son Mai

(57) ABSTRACT

In accordance with the present invention, a method is provided for testing dynamic random access memory under wafer-level-burn-in that substantially can overcome the disadvantage of requiring at a manufacturing period and which even further increases with the increase of the memory capacity being expanded. In the embodiment, first of all, there are pluralities of word lines that are arranged in parallel. Generally word line driver means respectively driving the word lines and concludes word line test means for receiving a test signal, and further for producing an output signal. The layout of input bit-line to bit-line can be cross-arranged. Thus, the main feature of the present invention is mentioned that voltage for bit-line can be divided as even-numbered voltage and odd-numbered voltage for cross toggling. Especially, all of the tests can be carried out in the fabrication period of a semiconductor factory. Also, the semiconductor memory device of this invention overcomes the above-identified problem and numerous other disadvantages and deficiencies of the conventional technology.

12 Claims, 5 Drawing Sheets

METHOD FOR TESTING DYNAMIC RANDOM ACCESS MEMORY UNDER WAFER-LEVEL-BURN-IN

BACKGROUND OF THE INVENTION

1. Field of the Invention

The invention relates to a test method for integrated circuit of semiconductor memory device under wafer-level-burn-in, and more particularly the test method will be employed in dynamic random access memory (DRAM) fabrication process.

2. Description of the Prior Art

Generally, semiconductor memory devices are tested by checking whether the intended data can be obtained for input of a particular address signal, thereby distinguishing between good and bad ones. Such as FIG. 1, it illustrates wafer-level-burn-in circuitry example of the experimental dynamic random access memory (DRAM). It will be mentioned that as FIG. 1, the system according to the prior art is schematically shown to include a plurality of word line, such as $WL_1$, $WL_2$, $WL_3$, $WL_4$, $WL_5$, . . . to $WL_n$ a word line driver 101, a sense amplifier 102, bit line (BL, BL) respectively. Some small transistors are implemented at each word line edge to simultaneously apply the stress bias to the transfer gates, especially by probing the corresponding test pads. Thus in the past few years, as the above figure shown, the DRAM under wafer-level-burn-in is stressed to word-line and bit-line, respectively. However, unfortunately this cannot be achieved the stress for the effect of cell-to-cell and cell-to-bit-line. Also, the test mode will be executed after all fabrication process completed.

As a matter of fact, in recent years, with advances in miniaturization techniques, the memory cell area has been further reduced. According to the above statement, which in turn has led to an increase in the failure rate attributed to short circuits between adjacent word lines or between adjacent bit lines within the memory array due to processing effects. Therefore, according to the conventional technology, verification of failure has been accomplished by sequentially reading every address location and thus determining the result. However, verification methods have the disadvantage of requiring a test period, which even further increases with the increase of the memory capacity being expanded. Certainly, it is important that spurious indications of defects should not be given. Therefore the testing result contains, in addition to the force cell device and the compared cell device. The cell device identifies digits of the serial checking vectors as to which no determination of correctness should be made.

SUMMARY OF THE INVENTION

In accordance with the present invention, a method is provided for testing integrated circuits of semiconductor memory device in wafer-level-burn-in that substantially can verify the disadvantage of requiring at a manufacturing period and which even further increases with the increase of the memory capacity being expanded.

Thus, according to this present invention, an apparatus for testing a dynamic random access memory that has a plurality of electrical cells under the wafer-level-burn-in will be described as follows. Firstly each electrical cell has a transfer gate and a capacitor. Then there are first transistors that respectively are connected with a plurality of odd bit lines for conducting charge stored in the capacitor via the transfer gate. Also, there are second transistors that respectively are connected with a plurality of even bit lines and conducting charge stored in the capacitor via the transfer gate. The first sense amplifiers are connected with the first transistors for amplifying the conducted charge. The second sense amplifiers are connected with the second transistors for amplifying the conducted charge. The first terminals provide a first bit line signal to control first transistors. Finally the second terminals provide a second bit line signal to control the second transistors. Especially, the first bit line signal has a voltage potential opposite the second bit line signal. The other main features of this invention are the following. The first transistors have a plurality of transistors having corresponding gate connected to receive the first bit line signal. The other second transistors includes a plurality of transistors having corresponding gate connected to receive the second bit line signal.

The method for testing a dynamic random access memory having a plurality of electrical cells under the wafer-level-burn-in includes the following steps. Firstly conducting a plurality of odd-numbered lines are carried out for receiving charge stored in each electrical cell of the dynamic random access memory. Then respectively amplifying the received charge from each electrical cell. Again, a plurality of even-numbered bit lines is conducted for receiving charge stored in each electrical cell of the dynamic random access memory. Finally, respectively amplifying the received charge will be achieved from each electrical cell. The odd-numbered bit lines and the even-numbered bit lines are both conducted in alternate periods.

Another embodiment will be described as follows. Firstly, conducting a plurality of even-numbered bit lines are carried out for receiving charge stored in each electrical cell of the dynamic random access memory, followed by respectively amplifying the received charge from each electrical cell. Again, a plurality of odd-numbered bit lines is conducted for receiving charge stored in each electrical cell of the dynamic random access memory. The final step involves respectively amplifying the received charge from each electrical cell. The even-numbered bit lines and the odd-numbered bit lines are both conducted in alternate periods.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. Also, the method of the present invention will be applied to a broad range of test and can be employed to a variety of DRAMrelated fabrication processes. The following description discusses one presently preferred embodiment of the test method of the present invention as implemented in the integrated circuit testing process. Since the majority of currently available methods are combined in DRAM fabrication process and the most commonly encountered applications of the present invention will involve wafer-level-burn-in problem. Nevertheless, the present invention may also be advantageously employed in semiconductor fabrication process and other semiconductor factories. Accordingly, application of the present invention is not intended to be limited to those devices fabricated in silicon semiconductor cell device, but will include those devices fabricated in one or more of the available semiconductor cell device.

Figure 1:
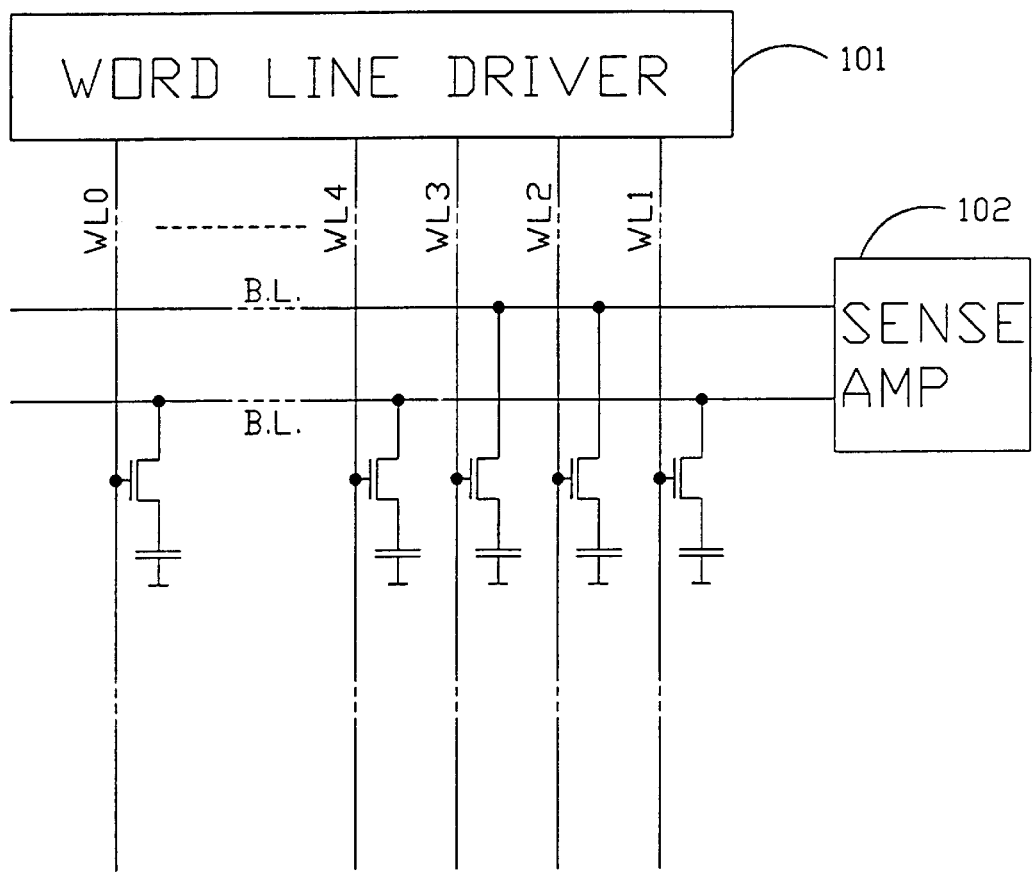
FIG. 1 is a circuit diagram schematically illustrating a conventional test technology.
Figure 2:
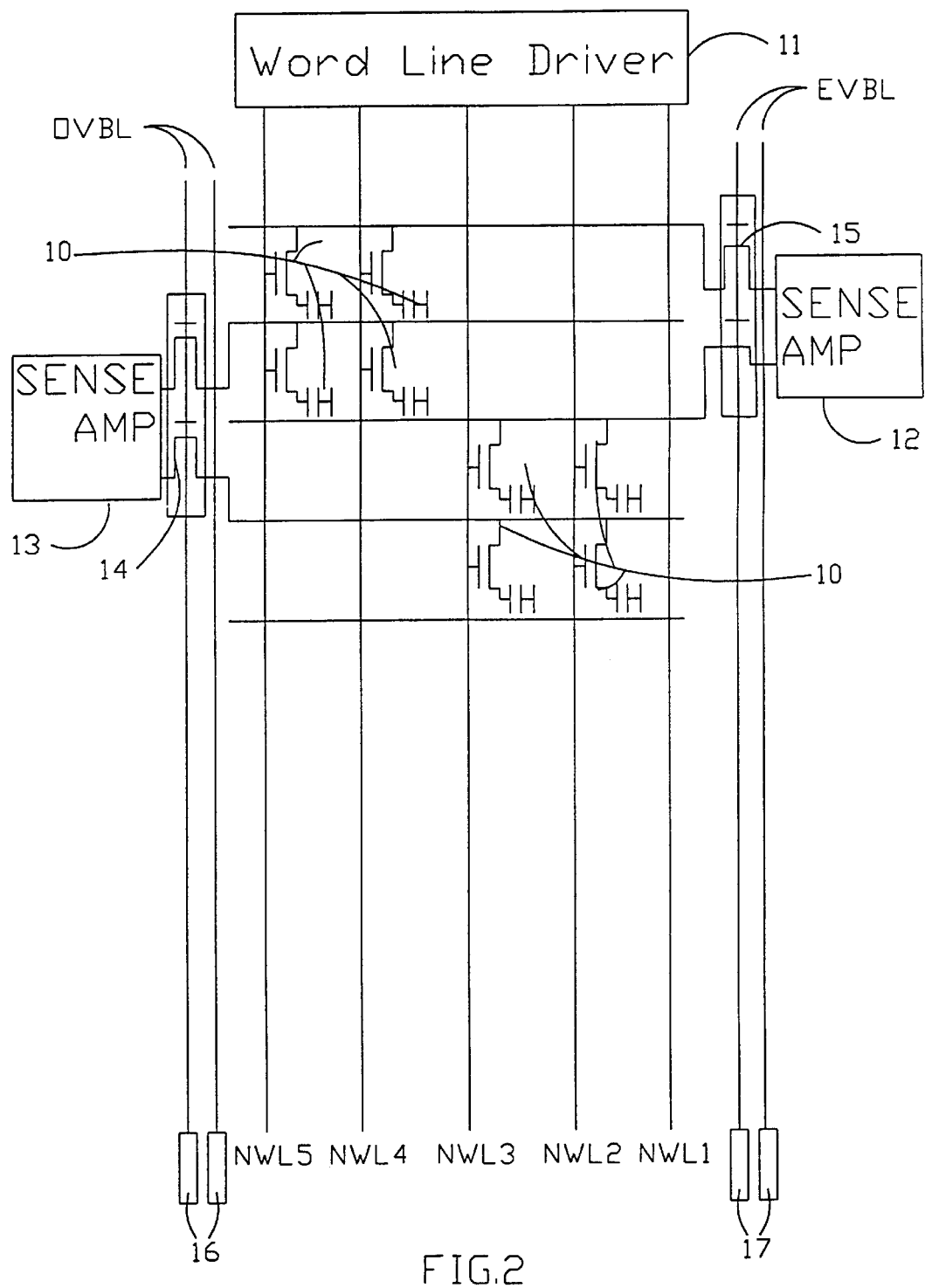
FIG. 2 is a circuit diagram schematically illustrating an embodiment of the invention.

With reference to FIG. 2, the system according to the present invention is schematically shown to include a plurality of word lines, such as $NWL_1$, $NWL_2$, $NWL_3$, $NWL_4$, and $NWL_5$, electrical cells 10, a word line driver 11, second sense amplifier 12 and first sense amplifier 13, first transistor 14 and second transistor 15, first terminal 16 and second terminal 17, odd voltage bit line (OVBL) and even bit line (EVBL), respectively.

Figure 3:
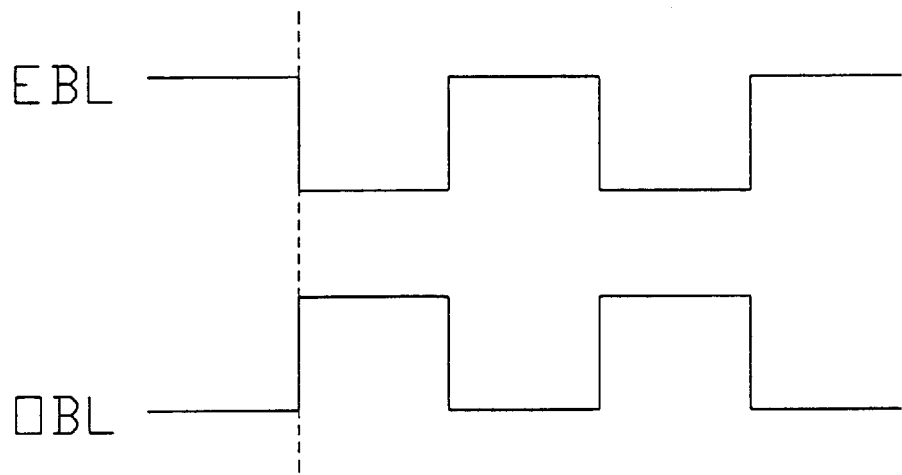
FIG. 3 is a circuit diagram schematically illustrating bit-line voltage of the invention.

With reference to FIG. 2, a wafer-level-burn-in circuitry example of the experimental dynamic random access memory (DRAM) is illustrated. Thus, in the present embodiment, the layout of input bit line to bit-line can be cross-arranged according to FIG. 2. Then, such as FIG. 3, the input voltage for bit-line (VBL) can be divided as even-numbered bit-line (EBL) and odd-numbered bit-line (OBL) and then both of EBL and OBL can be cross toggled. Here, the main features of this invention will be described as follows.

Basically, referring to FIG. 2, the apparatus of the present invention has a plurality of dynamic random access memory (DRAM) cells 10 and each of the DRAM cells 10 has transfer gates and capacitors. Also, the first transistors 14 are respectively connected with a plurality of add bit lines and are connected with the transfer gates. Second transistors 15 are respectively connected with a plurality of even bit lines and are connected with the transfer gates. The first sense amplifiers 13 are connected with the first transistors for amplifying the obtained signal. The second sense amplifiers 12 are connected with the second transistors for amplifying the obtained signal. Therefore, the first terminals 16 can provide a first bit line signal to control the first transistors. And the second terminals 17 can provide a second bit line signal to control the second transistors.

Thus, according to the above statement, and as shown as FIG. 2A, the first embodiment of this method for testing dynamic random access memory (DRAM) cells 10 and each of DRAM cells 10 having transfer gate and capacitors, the above method includes the following steps. Firstly, the plurality of odd bit lines are conducted with the first transistors 14 and the above transfer gates of cells. Then, the signal from a plurality of odd bit lines can be amplified and the electrical charge can be stored by using first sense amplifiers 13. Sequentially, a plurality of even bit lines with the second transistors 15 and the transfer gates are conducted. Simultaneously the steps for amplifying a plurality of even bit lines and for storing charge are carried out using second sense amplifiers 12. Then, detecting the first bit line signal is obtained from first terminals 16. Finally the second bit line signal is detected from second terminals 17.

The second embodiment is for testing dynamic random access memory (DRAM) cells 10 and each of DRAM cells 10 includes transfer gate and capacitors. As shown in FIG. 2B, firstly, the plurality of even bit lines are conducted with the second transistors 15 and the above transfer gates of cells. Then, the signal from a plurality of even bit lines can be amplified and the electrical charge can be stored by using second sense amplifiers 12. Sequentially, a plurality of odd bit lines with the first transistors 14 and the transfer gates are conducted. Simultaneously the steps for amplifying a plurality of odd bit lines and storing charge are carried out by using first sense amplifiers 13. Then, detecting the second bit line signal is obtained from first terminals 17. Finally the finally bit line signal is detected from second terminals 16.

In addition, the pre-selected word line drivers will conclude ones connected to odd-numbered word lines and even-numbered word lines. Also, the pre-selected word line drivers will compose ones connected to odd-numbered bit lines and even-numbered bit lines.

Figure 4A:
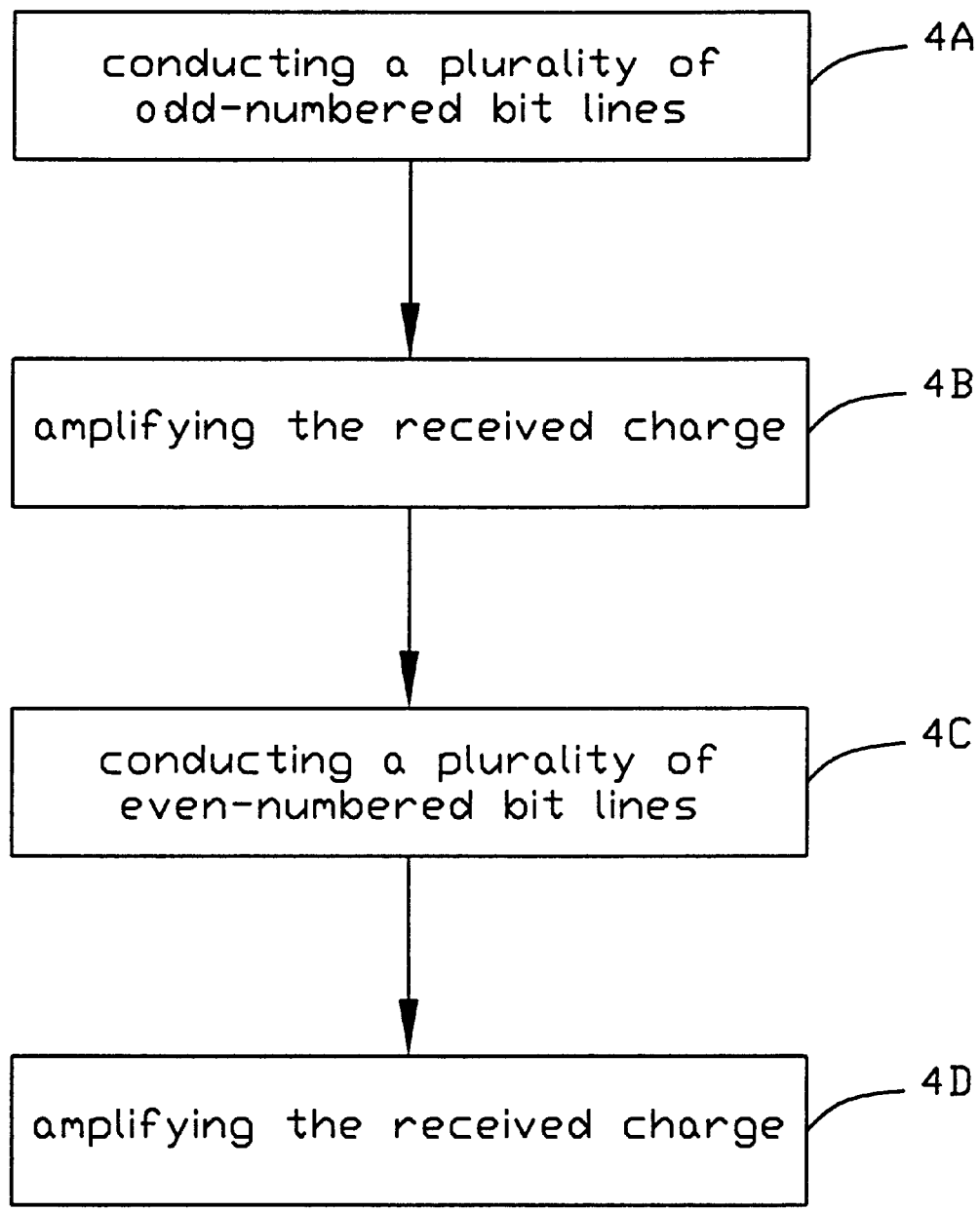
FIGS. 4A and 4B are flow chart diagrams schematically illustrating the present invention.

Thus, the basic description for this invention is as follows. Firstly, as shown in FIG. 4A, step 4A for conducting a plurality of odd-numbered bit lines is for receiving charge stored in each electrical cell of the dynamic random access memory. Then, step 4B is for respectively amplifying the received charge from each electrical cell. Consequentially step 4C is for conducting a plurality of even-numbered bit lines for receiving charge stored in each electrical cell of the dynamic random access memory. Finally, step 4D is for respectively amplifying the received charge from each electrical cell. The odd-numbered bit lines and the even-numbered bit lines are conducted in alternate periods.

Figure 4B:
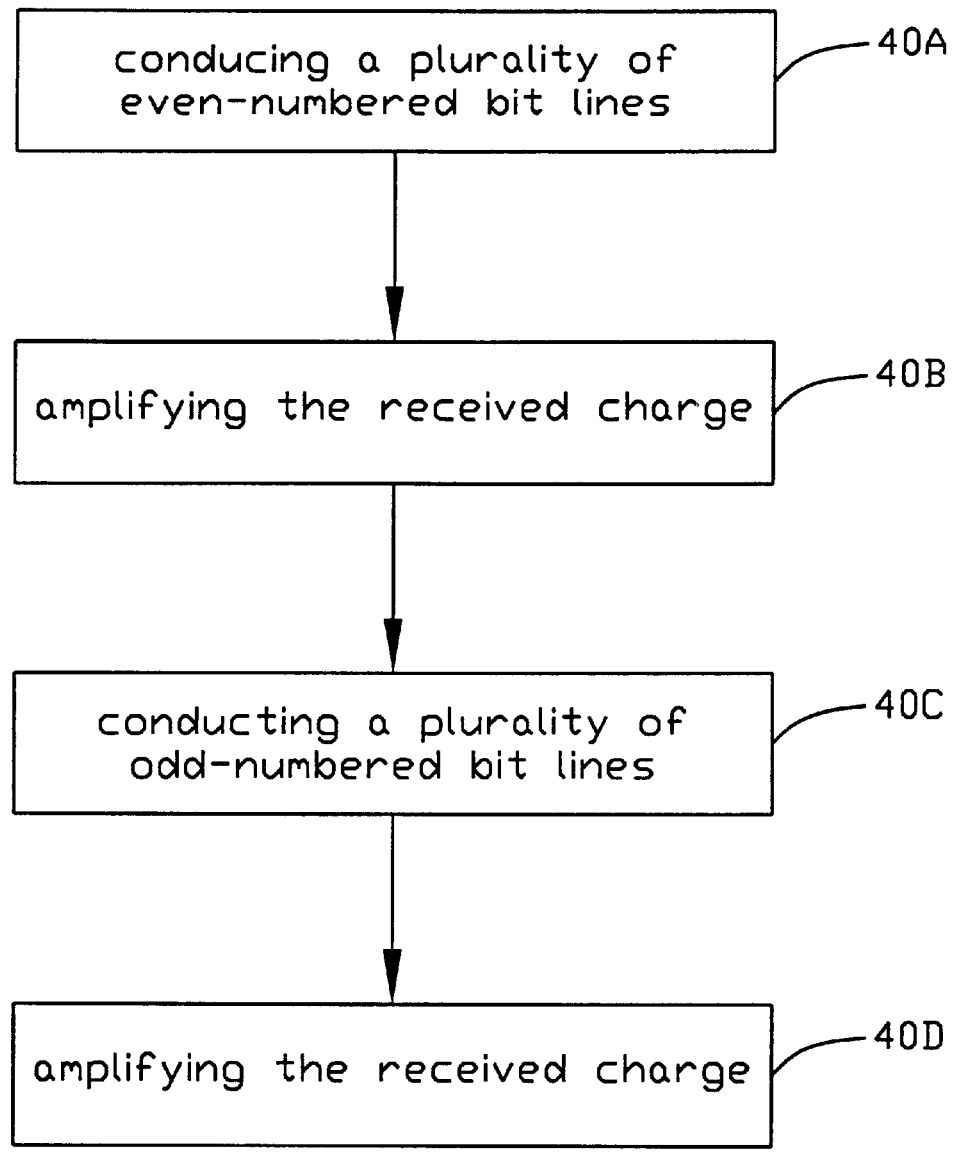

Another method for testing a dynamic random access memory that includes a plurality of electrical cells under the wafer-level-burn-in is shown as FIG. 4B. Step 4A is for conducting a plurality of even-numbered bit lines for receiving charge stored in each electrical cell of the dynamic random access memory. Step 4B is for respectively amplifying the received charge from each electrical cell. Then step 4C is for conducting a plurality of odd-numbered bit lines for receiving charge stored in each electrical cell of the dynamic random access memory. Finally step 4D is for respectively amplifying the received charge from each electrical cell.

Thus, in accordance with the present invention, a method is provided for testing dynamic random access memory in wafer-level-burn-in, that substantially can verify the disadvantage of requiring at a manufacturing period and which even further increases with the increase of the memory capacity being expanded.

In the embodiment, first of all, there are pluralities of word lines that are arranged in parallel. Generally word line drivers for respectively driving the word lines and concludes word line test means for receiving a test signal, and further for producing an output signal. The layout of input bit-line to bit-line can be cross-arranged. Thus, the main feature of the present invention is that voltage for bit-line can be divided as even-numbered voltage and add-numbered voltage for cross toggling. Especially, all of the test can be carried out in the fabrication period of semiconductor factory. Also, the semiconductor memory device of this invention overcomes the above-stated problem and numerous other disadvantages and deficiencies of the conventional technology.

Although specific embodiments have been illustrated and described, it will be obvious to those skilled in the art that various modifications may be made without departing from what is intended to be limited solely by the appended claims.

What is claimed is:

1. An apparatus for testing a random access memory having a plurality of electrical cells under wafer-level-burn-in comprising:

each said electrical cell having a transfer gate and a capacitor;

transistors respectively connected with a plurality of odd bit lines and even bit lines for conducting charge stored in the capacitor via the transfer gate;

sense amplifiers connected with said transistors for amplifying the conducted charge; and terminals for providing a first bit line signal and a second bit line signal to control said transistors, wherein the first bit line signal has a voltage potential opposite to the second bit line signal.

2. The apparatus according to claim 1, wherein said random access memory is a dynamic random access memory.

3. The apparatus according to claim 1, wherein said transistors have corresponding gate connected to receive the first bit line signal and the second bit line signal.

4. An apparatus for testing a dynamic random access memory having a plurality of electrical cells under wafer-level-burn-in comprising:

each said electrical cell having a transfer gate and a capacitor;

first transistors respectively connected with a plurality of odd bit lines for conducting charge stored in the capacitor via the transfer gate;

second transistors respectively connected with a plurality of even bit lines and conducting charge stored in the capacitor via the transfer gate;

first sense amplifiers connected with said first transistors for amplifying the conducted charge;

second sense amplifiers connected with said second transistors for amplifying the conducted charge;

first terminals for providing a first bit line signal to control said first transistors; and second terminals for providing a second bit line signal to control said second transistors, wherein the first bit line signal has a voltage potential opposite to the second bit line signal.

5. The apparatus according to claim 4, wherein said first transistors have corresponding gate connected to receive the first bit line signal.

6. The apparatus according to claim 4, wherein said second transistors have corresponding gate connected to receive the second bit line signal.

7. A method for testing a random access memory having a plurality of electrical cells under wafer-level-burn-in comprising the steps of:

respectively conducting a plurality of odd-numbered bit lines and respectively conducting a plurality of even-numbered bit lines for receiving charge stored in each electrical cell of said random access memory; and respectively amplifying the received charge from each electrical cell.

8. The method according to claim 1, wherein said random access memory is a dynamic random access memory.

9. A method for testing a dynamic random access memory having a plurality of electrical cells under wafer-level-burn-in comprising the steps of:

conducting a plurality of odd-numbered bit lines for receiving charge stored in each electrical cell of said dynamic random access memory;

respectively amplifying the received charge from each electrical cell;

conducting a plurality of even-numbered bit lines for receiving charge stored in each electrical cell of said dynamic random access memory; and respectively amplifying the received charge from each electrical cell.

10. The method according to claim 3, wherein said odd-numbered bit lines and said even-numbered bit lines are conducted in alternate periods.

11. A method for testing a dynamic random access memory having a plurality of electrical cells under wafer-level-burn-in comprising the steps of:

conducting a plurality of even-numbered bit lines for receiving charge stored in each electrical cell of said dynamic random access memory;

respectively amplifying the received charge from each electrical cell;

conducting a plurality of odd-numbered bit lines for receiving charge stored in each electrical cell of said dynamic random access memory; and respectively amplifying the received charge from each electrical cell.

12. The method according to claim 5, wherein said odd-numbered bit lines and said even-numbered bit lines are conducted in alternate periods.

* * * * *